United States Patent [19]
Brommer et al.

[11] Patent Number: 5,187,461
[45] Date of Patent: Feb. 16, 1993

[54] LOW-LOSS DIELECTRIC RESONATOR HAVING A LATTICE STRUCTURE WITH A RESONANT DEFECT

[76] Inventors: Karl Brommer, Box 53, Hampton Falls, N.H. 03844; Henry Mullaney, 271 Chestnut Hill Rd., Amherst, N.H. 03031; Robert Meade, 54 Berkeley St., Somerville, Mass. 02143; Andrew Rappe, 5133 Briarwood Dr., Macungie, Pa. 18062; John Joanopoulos, 165 Oakley Rd., Belmont, Mass. 02178

[21] Appl. No.: 656,812
[22] Filed: Feb. 15, 1991
[51] Int. Cl.$^5$ .............................................. H01P 7/10
[52] U.S. Cl. .............................. 333/219.1; 428/304.4; 428/323
[58] Field of Search ............................ 333/219.1, 219; 428/304.4, 313.3, 323

[56] References Cited

U.S. PATENT DOCUMENTS

| | | | |
|---|---|---|---|
| 3,553,694 | 1/1971 | Clark | 505/874 X |
| 3,698,001 | 10/1972 | Koyama et al. | 343/909 |
| 3,765,773 | 10/1973 | Weiner | 356/364 |
| 4,632,517 | 12/1986 | Asher | 359/296 |

FOREIGN PATENT DOCUMENTS 1393633  5/1975  United Kingdom ................. 333/219

OTHER PUBLICATIONS

K. S. Kelleher and C. Goatley, "Dielectric Lens for Microwave", *Electronics* (1955).
Sajeev John and Raghavan Rangarajan, "Optical Structures for Classical Wave Localization: An Alternative to the Ioffe-Regel Criterion", vol. 38:14 (1988).
K. Ohtaka, "Energy Band of Photons and Low-Energy Photon Diffraction", vol. 19:10 (May 15, 1979).
International Search Report, PCT/US92/01228, (Jul. 13, 1992).
Yablonovitch, Eli, "Inhibited Spontaneoud Emission in Solid-State Physics and Electronics", *Physical Review Letters*, 58:20:2059-2062, (May 1987).
Mongia, R. K., "Resonant Frequency of Cylindrical Dielectric Resonator Placed in an MIC Environment", *IEEE Transaction on Microwave Theory and Techniques*, 38:6:802-804, (Jun. 1990).
Kobayashi, Yoshio, et al., "Influence of Conductor Shields on the Q-Factors of a $TE_O$ Dielectric Resonator", *MIT-S. Digest*, Pp. 281-284, (1985).
Yablonovitch, E. et al., "Photonic Band Structure: The Face-Centered-Cubic Case", *Physical Review Letters*, 63:18: 1950-1953, (Oct. 1989).
Leung, K. M. et al., "Full Vector Wave Calculation of Photonic Band Structure in Face-Centered-Cubic Dielectric Media", *Physical Review Letters*, 65:21:2646-2649, (Nov. 1990).

(List continued on next page.)

*Primary Examiner*—Paul M. Dzierzynski
*Assistant Examiner*—Benny T. Lee
*Attorney, Agent, or Firm*—Hamilton, Brook, Smith & Reynolds

[57] ABSTRACT

A dielectric resonator comprising a resonant defect structure disposed in a lattice structure formed of a plurality of multi-dimensional periodically arranged dielectric elements confines electromagnetic energy within a frequency band in the photonic band gap. The frequency band of the confined electromagnetic energy is tunable. The unique structure of the dielectric resonator leads to reduced power dissipation losses when used in microwave and millimeter wave components. Accordingly, the dielectric resonator may be used to produce high quality resonant cavities, filters and power generators.

13 Claims, 13 Drawing Sheets

OTHER PUBLICATIONS

Ho, K. M. et al., "Existence of a Photonic Gap in Periodic Dielectric Structures", *Physical Review Letters*, 65:25:3152–3155, (Dec. 1990).

Zhang, Ze et al., "Electromagnetic Wave Propagation in Periodic Structures: Bloch Wave Solution of Maxwell's Equations", *Physical Review Letters*, 65:21:2650–2653, (Nov. 1990).

Ho, K. M. et al., "Comment on 'Theory of Photon Bands in Three–Dimensional Periodic Dielectric Structures'", *Physical Review Letters*, 66:3:393 (Jan. 1991).

Satpathy, S. et al., "Comment on 'theory of Photon Bands in Three–Dimensional Periodic Dielectric Structures'", *Physical Review Letters*, 66:3:394, (Jan. 1991).

Navarro, A. et al., "Study of $TE_O$ and $TM_O$ Modes in Dielectric Resonators, by a Discrete Fourier Transform", *IEEE Transactions on Microwave Theory and Technique* 39:1:14–17, (Jan. 1991).

Weisshaar, Andreas, et al., "Perturbation Analysis and Modeling of Curved Microstrip Bends", *IEEE Transactions on Microwave Theory and Techniques,* 38:10:1449–1454, (Oct. 1990).

Kato, Haruhiko et al., "A 30 GHz MMIC Receiver for Satellite Transponders", *IEEE Transactions on Microwave Theory and Techniques,* 38:7:896–902, (Jul. 1990).

Yablonovitch, E. et al., Abstract: "Photonic Band Structure: the Face–Centered–Cubic Case Employing Non–Spherical Atoms", 1–16.

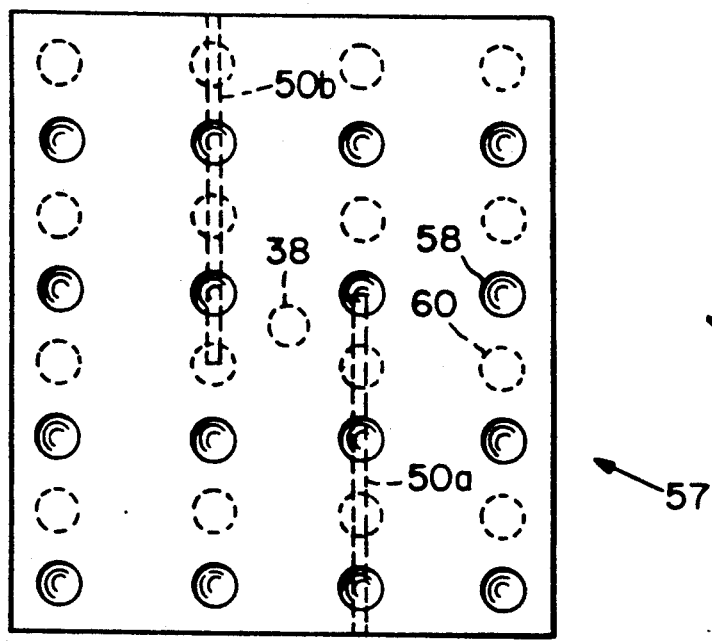
Fig. 6B
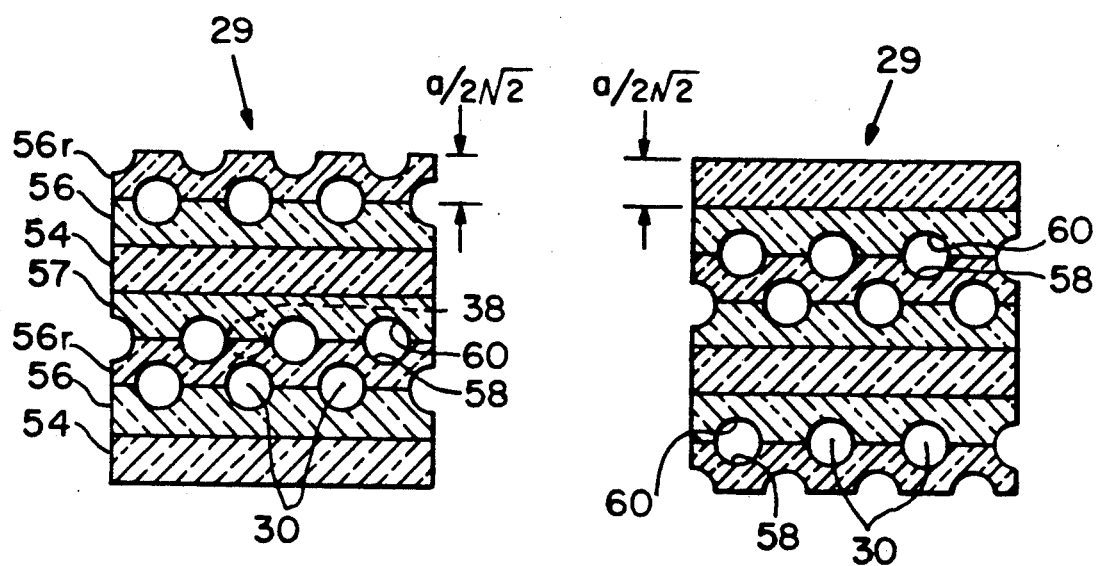
Fig. 7A
Fig. 7B

LOW-LOSS DIELECTRIC RESONATOR HAVING A LATTICE STRUCTURE WITH A RESONANT DEFECT

BACKGROUND

This invention was made with government support under Contract Number N00014-86-K-0158 awarded by the Department of the Navy and Contract Number DAAL-03-86-K-0002 awarded by the Department of the Army. The government has certain rights in the invention.

Resonant cavities form an essential part of many microwave components including filters, waveguides, couplers and power combiners. A typical dielectric resonator for a microwave integrated circuit comprises a metallic box enclosing a disk of dielectric material deposited on a substrate with a much smaller dielectric constant. Dielectric materials are favored for most microwave applications because the high dielectric constants available through some materials make compact circuit components possible.

These compact microwave components, however, are realized at the cost of power dissapation. Practical microwave integrated circuits are lossy compared to metallic resonant cavities, suffering power losses through the following two principle mechanisms. Since practical dielectrics are far from lossless, power is dissipated through the induced polarization of the dielectric material in a time-harmonic electric field. Also, practical dielectrics do not completely confine electromagnetic radiation, so a conductive metallic shielding surrounds the resonator to reduce radiation losses. The shield has a non-zero resistivity which results in ohmic power dissipation.

SUMMARY OF THE INVENTION

It is known that a three-dimensional periodic dielectric structure having the proper symmetry can perfectly reflect incident electromagnetic radiation, incident from any orientation, within a frequency band producing a photonic band gap. Thus, electromagnetic energy at frequencies within the band gap is prohibited from propagating through the structure. In accordance with the present invention, a dielectric resonator comprises a resonant defect structure positioned in a lattice structure formed of a plurality of multi-dimensional periodically related dielectric elements which are disposed in a dielectric background material. The resonant structure confines electromagnetic energy within a frequency band in the photonic band gap. More specifically, electromagnetic energy having frequencies near the resonant frequency of the defect structure is stored within the resonant structure. Significantly, a dielectric resonator that employs this unique structure provides a reduced power dissipation over conventional devices, leading to more efficient performance.

The dielectric resonator lattice structure has a preferred diamond crystal symmetry, although any face-centered cubic lattice arrangement may be used. The periodically related dielectric elements may comprise overlapping spheres of a high-dielectric material. Since the spheres overlap, the background material may comprise air or an equivalent low-dielectric material. Alternatively, the dielectric elements may be spherical regions of air or an equivalent low-dielectric material positioned in a high-dielectric background material.

In either case, the resonant defect structure is positioned in the lattice structure creating a resonant defect within the resonator. The resonant defect structure may be comprise air or a dielectric material. Further, a coupling means may be coupled to the resonant cavity. The coupling means may comprise a first waveguide for coupling electromagnetic energy to the resonant structure and a second waveguide for coupling electromagnetic energy out of the resonant structure.

By positioning the defect structure in the dielectric resonator, electromagnetic energy in a narrow frequency band within the photon band gap propagating through the resonator is coupled into the defect structure. Once inside the defect structure, this energy remains trapped. Since the resonant frequency of the defect structure corresponds to the center frequency of the frequency band of the stored energy, the frequency band may be tuned during construction of the resonator. Course tuning may be accomplished by choosing a diamond lattice constant which centers the photonic band gap on the desired resonant frequency. Fine tuning may be accomplished by changing the size of the defect structure. Additionally, a fabricated resonator may be tuned by magnetizing the dielectric background material. More specifically, the magnetized background material effectively shifts the entire frequency band of stored electromagnetic energy.

The present invention also comprises two methods for manufacturing a dielectric resonator. One method is directed toward manufacturing a resonant structure comprised of a plurality of periodically related air spheres in a high-dielectric backing material. The other method is for manufacturing a dielectric resonator comprising overlapping periodically related high-dielectric spheres in a low dielectric environment.

Although localized electromagnetic energy in a narrow freqency band is common in metallic cavities, narrow frequency band electromagnetic energy stored within an entirely dielectric medium is a novel phenomenon. To that end, the present invention exploits this effect to provide high quality resonant cavities, filters, resonant absorbers and power generators in the microwave and millimeter wave regions.

DETAILED DESCRIPTION OF THE DRAWINGS

In the enclosed drawings like reference characters refer to the same parts throughout the different views. The drawings are not necessarily to scale, emphasis instead being placed upon illustrating the principles of the present invention.

FIG. 6B is a plan view of a sheet illustrating the coupling means.

FIG. 7A is a cross-sectional view of an assembled dielectric resonator.

FIG. 7B is an alternative cross-sectional view of an assembled dielectric resonator.

DETAILED DESCRIPTION OF THE INVENTION

Figure 1:
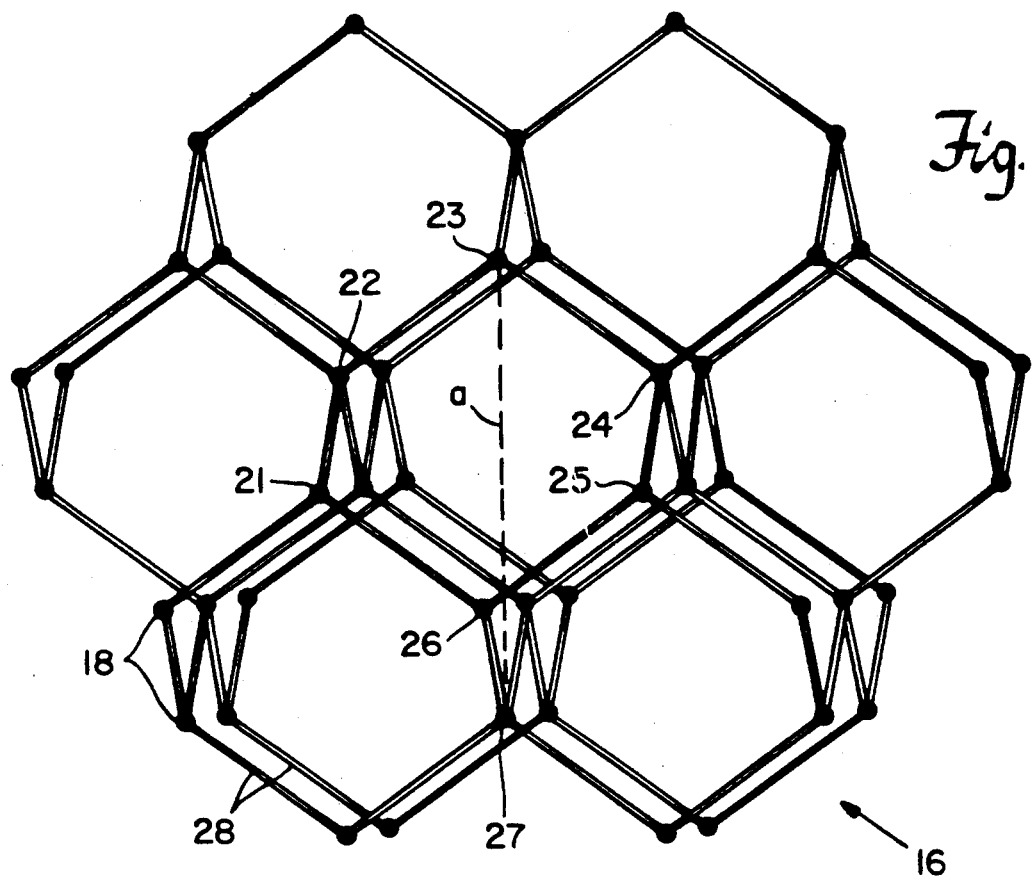
FIG. 1 is a schematic illustration of a three-dimensional diamond crystal lattice structure.

In accordance with the present invention, a skeletal structure of a three-dimensional dielectric lattice 16 is shown in FIG. 1. A plurality of nodes 18 represent the preferred location of the periodically arranged dielectric elements in the lattice. A number of lines 28 are shown to illustrate the symmetry of the lattice 16. Alternatively, the nodes 18 may be positioned at the midpoint of each line 28. Nodes 21-26 signify the elements which surround a resonant defect cavity (not shown) in the preferred embodiment. As shown in FIG. 1, the nodes 18 of the lattice 16 form a crystal with diamond lattice symmetry. However, it should be noted that any lattice with three-dimensional periodicity is within the scope of the present invention.

Figure 2A:
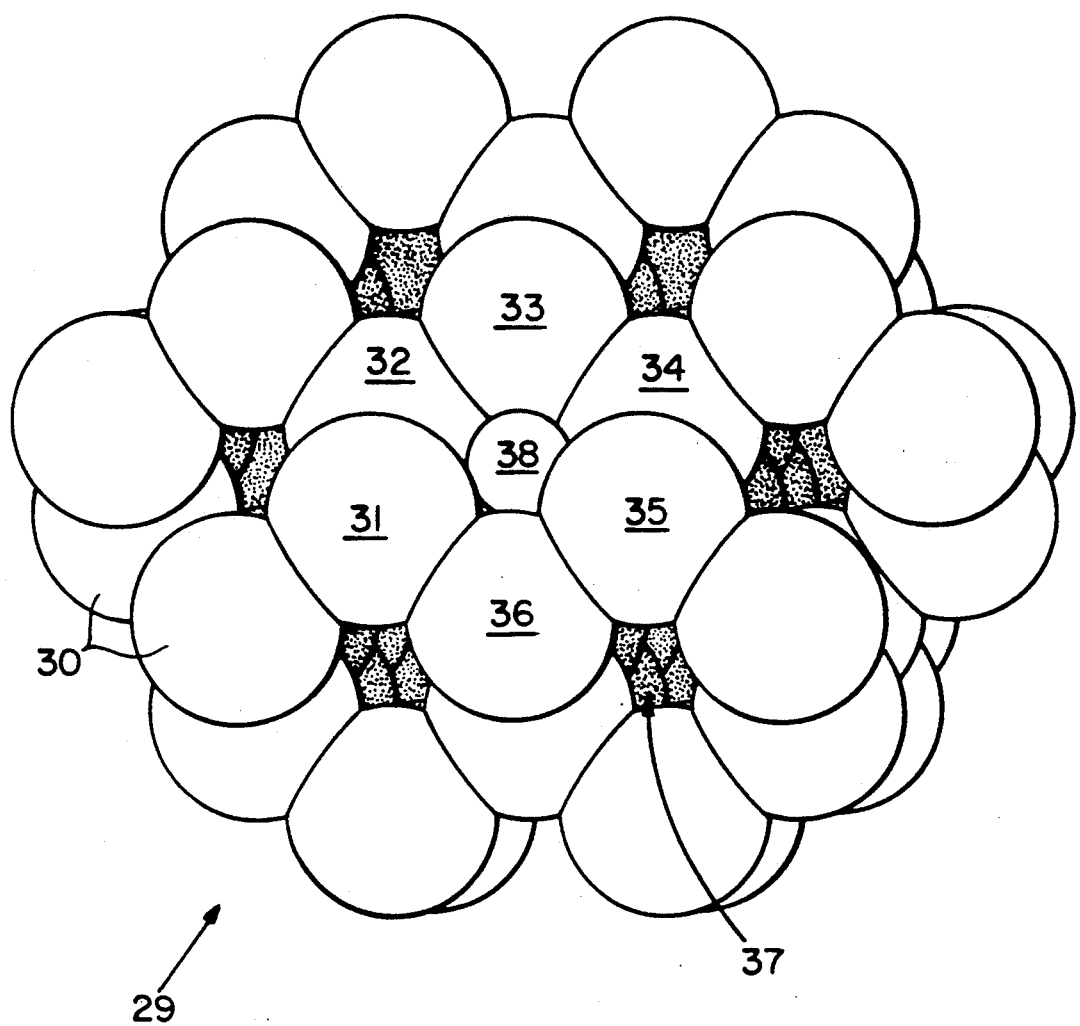
FIGS. 2A–2C are perspective views of three-dimensional dielectric resonators in accordance with the present invention.

As shown in FIG. 2A, a dielectric resonator 29 has a three-dimensional dielectric lattice structure comprised of a plurality of overlapping dielectric spheres 30 having a diamond lattice symmetry. Although spherical dielectric elements are used in the preferred embodiments, any shaped element may be employed without departing from the scope of the present invention. A background dielectric material 37 is located in the interstital regions around the spheres 30. In this embodiment, the spheres 30 are simply regions of air or any low-loss, low-dielectric constant material periodically arranged in a high-dielectric background material 37. A resonant defect 38 surrounded by air spheres 31-36 comprises an extra hole in the background material.

Figure 2B:
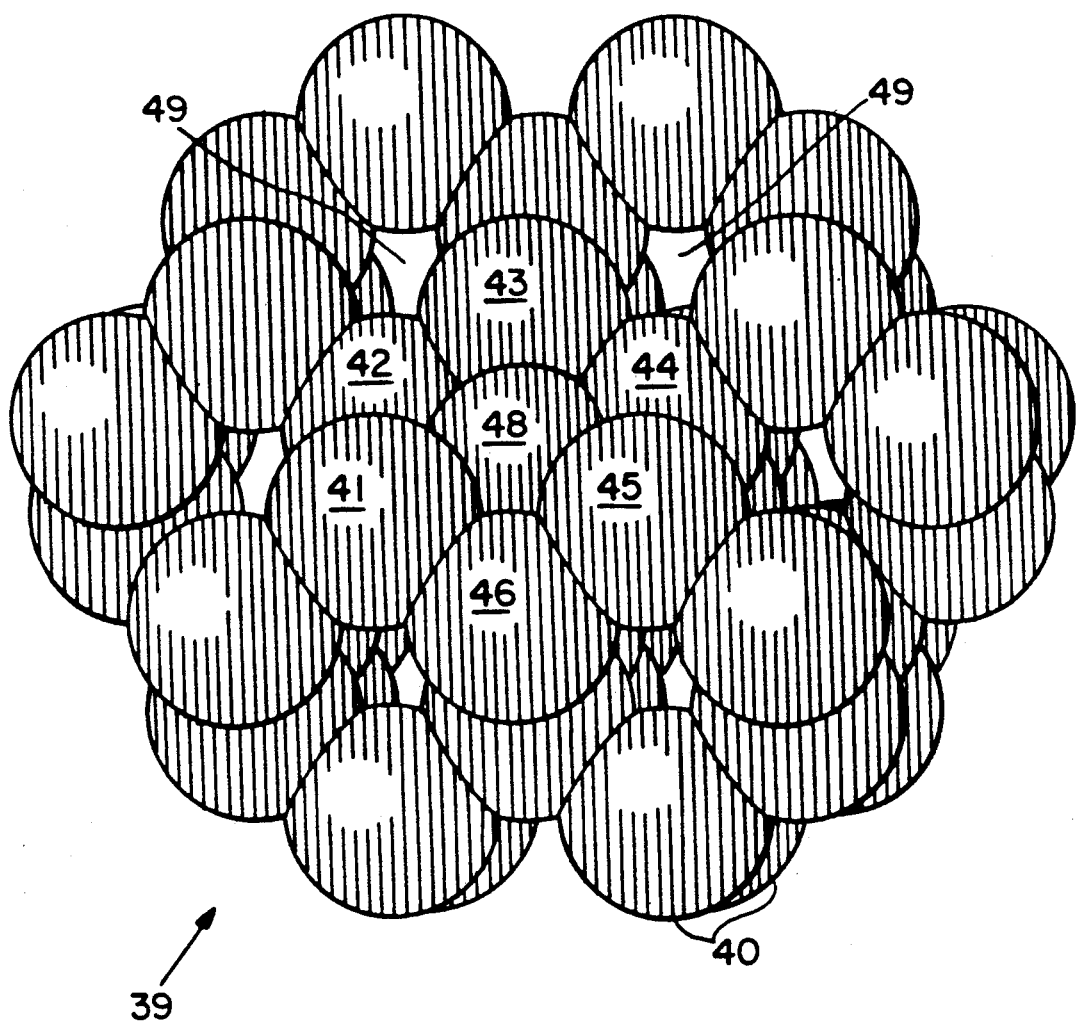
Figure 2C:
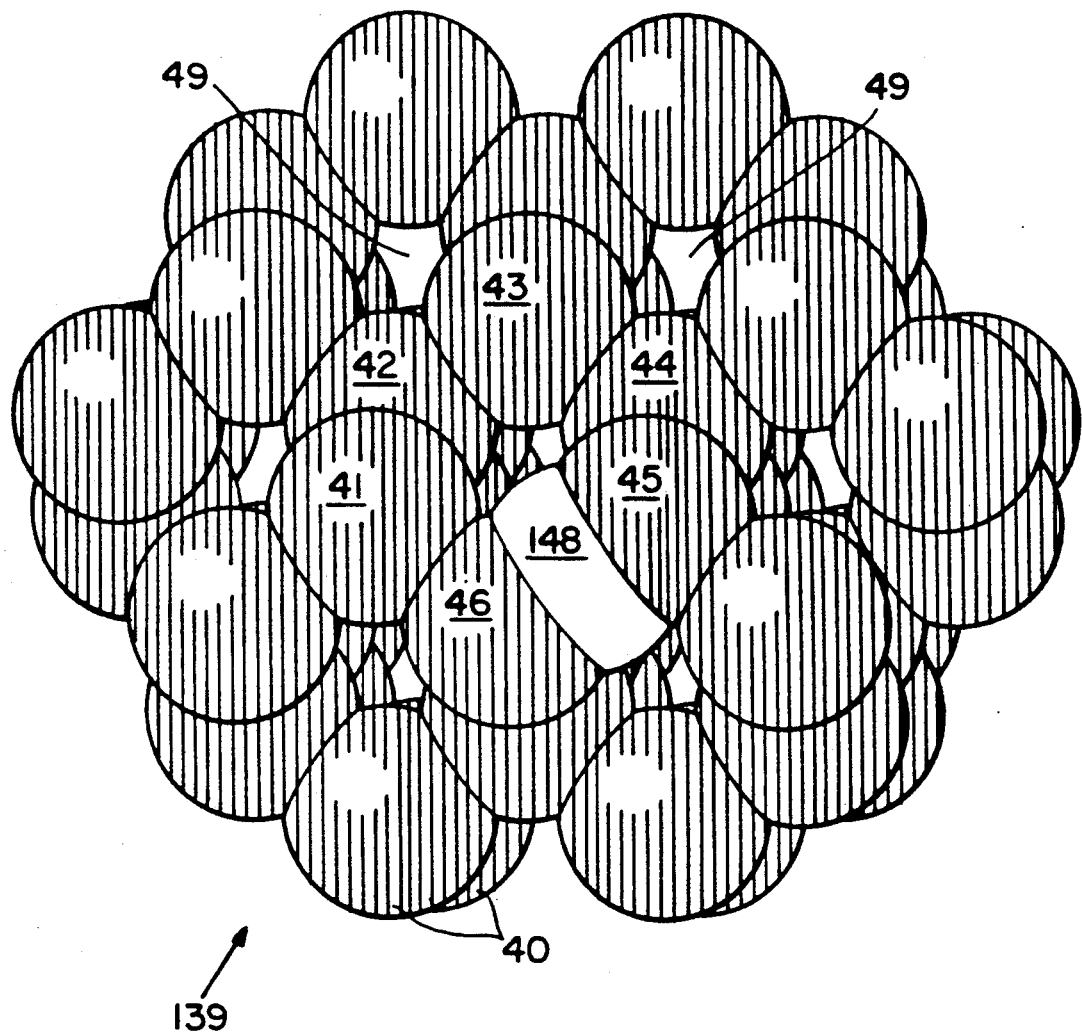

Alternatively, a dielectric resonator 39, shown in FIG. 2B, has a three-dimensional diamond lattice structure comprising a plurality of overlapping high-dielectric spheres 40 arranged to form a diamond lattice symmetry. Since the spheres 40 overlap, the interstital regions 49 of the lattice 39 may comprise air. A resonant defect cavity 48 may be formed by milling away a portion of adjacent spheres 41–46. An alternative resonant defect cavity 148 may be disposed between two spheres as shown in FIG. 2C. The cavity 148 is formed by milling away portions of dielectric spheres 45 and 46. In any of the resonator configurations of FIGS. 2A–2C, the resonant defect cavity serves to confine electromagnetic energy within a frequency band in the photonic band gap as long as the dielectric constant of the spheres is substantially different from the background material. Also, in any of the above-described configurations, the resonant defect cavity may comprise air or any low-dielectric material or a high-dielectric material.

In accordance with one feature of the present invention, for any of the dielectric resonators in FIGS. 2A-2C, the frequency band of electromagnetic energy within the photonic band gap stored by the resonant defect cavity may be tuned during construction of the resonator. As explained previously, the resonant frequency of the cavity corresponds to the center frequency of the frequency band of stored electromagnetic energy. Two parameters affect the cavity's resonant frequency: the diamond lattice constant and the size of the defect cavity. Referring to FIG. 1, a diamond lattice constant (a) for the diamond crystal lattice 16 equals the distance between the centers of two elements of a crystal, corresponding to the length between elements 23 and 27. The diamond lattice constant is inversely proportional to the frequency range of the photonic band gap. In fact, the photonic band gap center frequency ($f_p$) may be approximately determined by the following equation:

$$f_p = c/\sqrt{\epsilon} \ (a)$$

where
 $\epsilon$ = average dielectric constant of the lattice plus its background material and
 c = speed of light.

Figure 3:
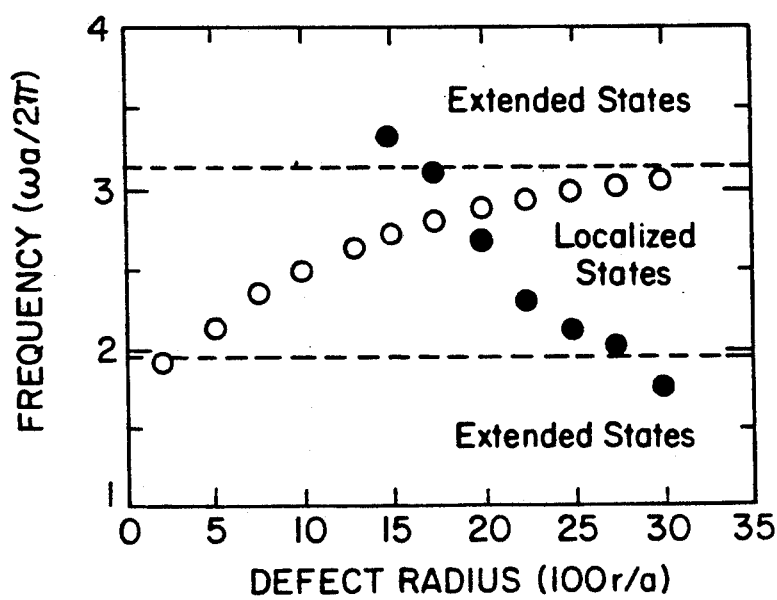
FIG. 3 is a graph showing the relationship between resonant frequency and defect radius.

Thus, coarse tuning of the cavity resonant frequency is accomplished by choosing a diamond lattice constant which centers the photonic band gap on the desired resonant frequency. The actual location of the resonant frequency of the cavity inside the photonic band gap is related to the size of the defect. FIG. 3 shows the relationship between the radius of the resonant defect cavity and its resonant frequency. For a cavity resonator 29 having air spheres 30 in a high-dielectric background material 37 (FIG. 2A) or for a cavity resonator 39 having high-dielectric spheres 40 in air (FIGS. 2B-2C), the radius of an air cavity 38 or 48 is proportional to its resonant frequency. Alternatively, for a cavity resonator having high-dielectric spheres in an air environment or air spheres in a high-dielectric environment, the radius of a high-dielectric cavity is inversely proportional to its resonant frequency. In either case, fine tuning of the cavity resonance frequency within the band gap is accomplished by changing the defect size.

Figure 4A:
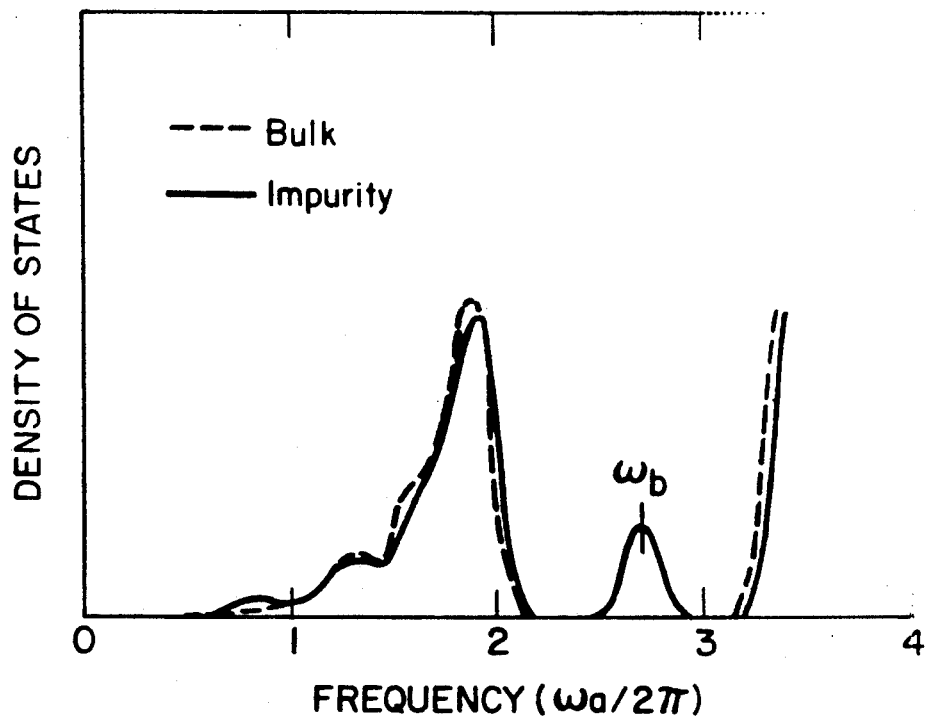
FIG. 4A is a graph showing the relationship between the density of states and frequency.

Another important feature of the present invention is the ability of the resonant cavity to confine electromagnetic energy in a narrow frequency band within the photonic band gap as shown in FIG. 4A. A perfect three-dimensional dielectric structure having diamond lattice symmetry (no resonant cavity) reflects electromagnetic energy from any incident orientation, thereby creating a photonic band gap which is represented by dashed line in FIG. 4A. By putting a resonant defect cavity in the dielectric structure, energy within a narrow frequency band coupled into the cavity is trapped. No matter how it propagates once inside the cavity, it is reflected back due to the periodic arrangement of spherical elements. This feature is also shown in FIG. 4A. The density function is loosely related to the resonant frequency of the cavity. For all electromagnetic wave vector orientations for a given frequency, the density function averages the transmissivity of the cavity. Thus, the cavity exhibits a large transmissivity at the edge frequencies of the photonic gap. However, inside the gap there is no transmission except near the resonant frequency of the cavity ($\omega_b$). The graph shows a fairly broad spread about $\omega_b$ which is due to calculation limitations. In practice, the spread can be narrowed by increasing the number of periodic spherical elements surrounding the cavity.

Figure 5:
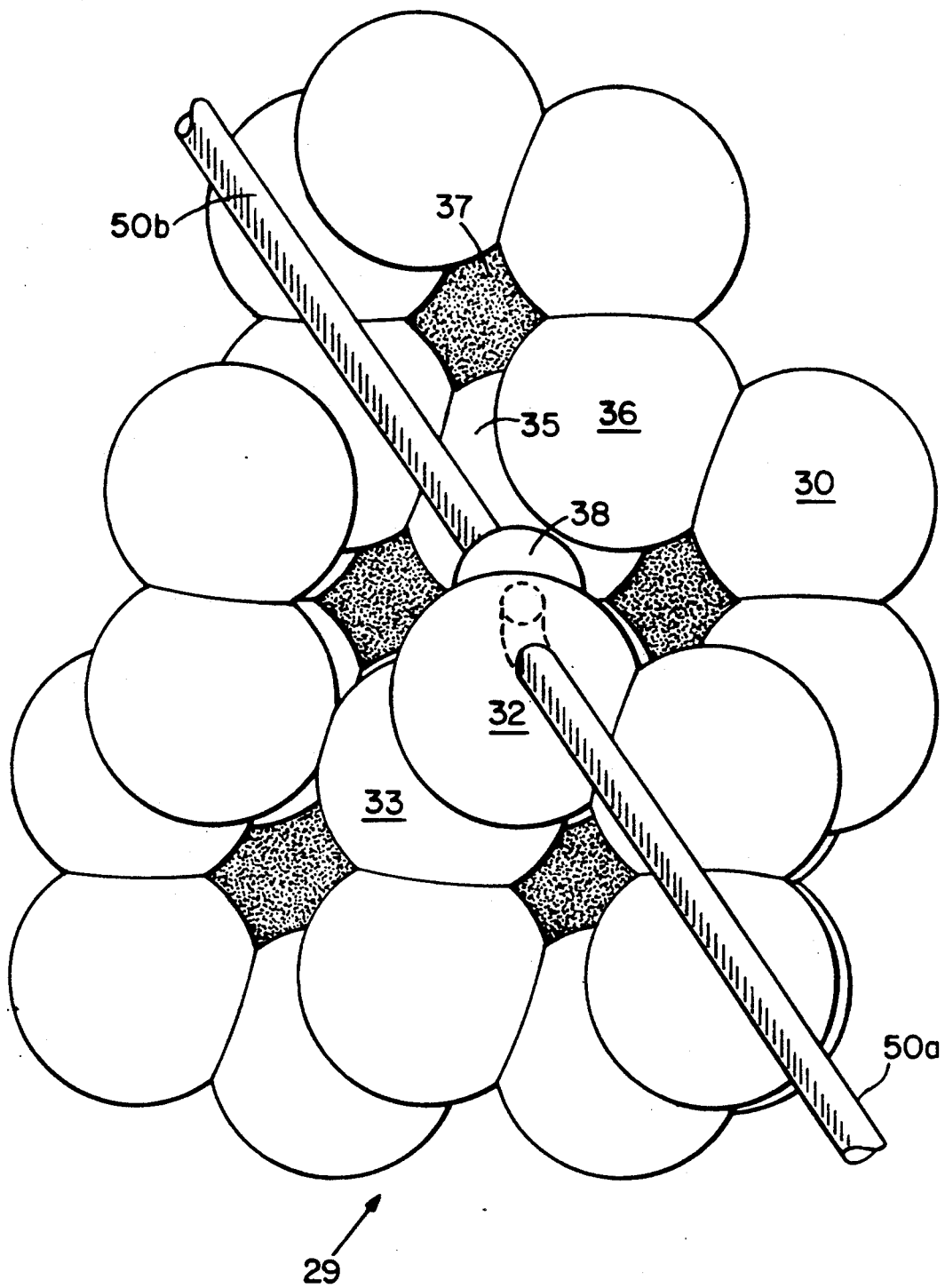
FIG. 5 is a perspective view illustrating a dielectric resonator having coupling means coupled to the resonant cavity.

Until now, the dielectric resonator has been described without any discussion as how energy is coupled into the resonant cavity. As shown in FIG. 5, a generic two-port resonator device can be constructed from the dielectric resonator 29 by adding a coupling means to the cavity 38. Two paths to the cavity are formed by milling through the two adjacent dielectric spheres 32 and 35. The paths are filled with a high-dielectric material. Thus, by making a small modification in the lattice structure, input and output paths are formed for coupling energy to the resonant cavity. Preferably, dielectric waveguides 50a and 50b are placed in the paths, each connecting to the cavity. As a result, the input waveguide 50a provides a path for electromagnetic energy into the cavity, and the output waveguide 50b provides an path for narrow frequency band electromagnetic energy from the cavity.

There are a number of different methods for manufacturing a dielectric resonant structure ranging from arranging spherical elements as a three-dimensional structure to drilling holes in sheets of a substrate. The following is a method for manufacturing a resonant structure comprised of periodically related air spheres in a high-dielectric substrate. As shown in FIGS. 7A-7B, a representative dielectric resonator may be constructed from a plurality of stacked sheets of substrate. While seven sheets are used for this embodiment, any number of sheets can be used without departing from the scope of this invention.

Figure 6A:
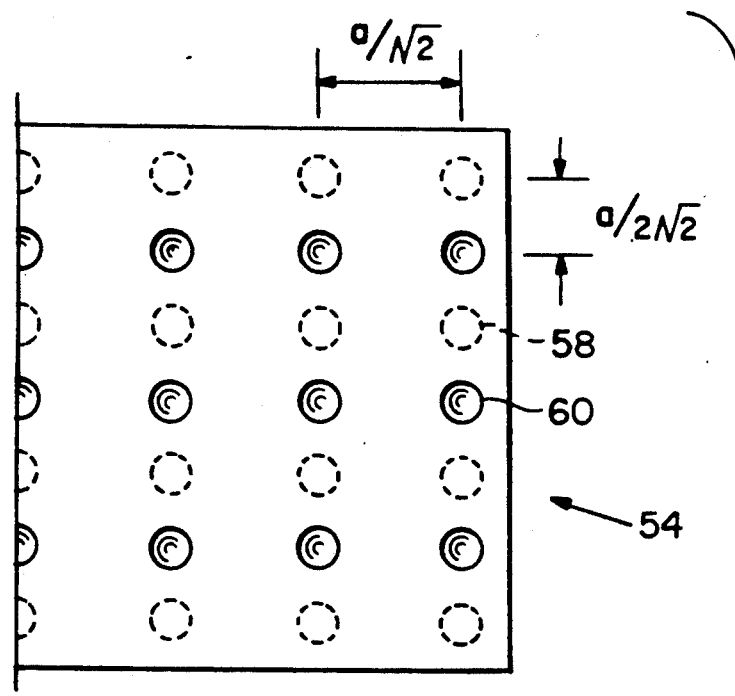
FIG. 6A is a plan view of the periodic pattern of elements for two representative sheets which are assembled to form a dielectric resonator.
Figure 6A:
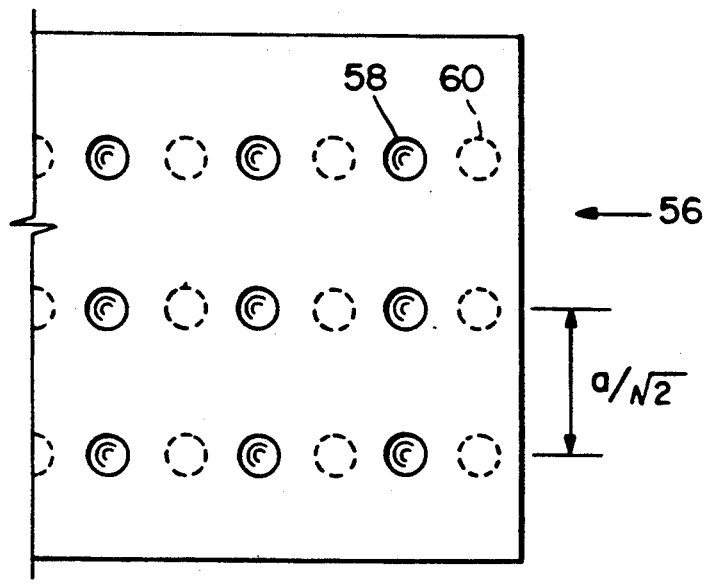

Referring to FIG. 6A, hemispheres 58 and 60 are drilled in a square pattern into the top and bottom of each sheet respectively. The hemispheres 58 drilled into the top of each sheet are displaced from the hemispheres 60 drilled in the bottom of each sheet. The length of displacement corresponds to the lattice constant (a) such that the final structure represents a three-dimensional diamond crystal lattice of periodic air spheres separated by a distance (a). The drilling pattern for adjacent sheets is rotated ninety degrees. Thus, every other sheet has the drilling pattern of sheet 54 while the remaining sheets have the drilling pattern of sheet 56. As shown in FIG. 6B, a sheet 57, which is a modified version of the sheet 54, has the resonant cavity 38 and two channels for the coupling waveguides 50a and 50b.

Figure 6C:
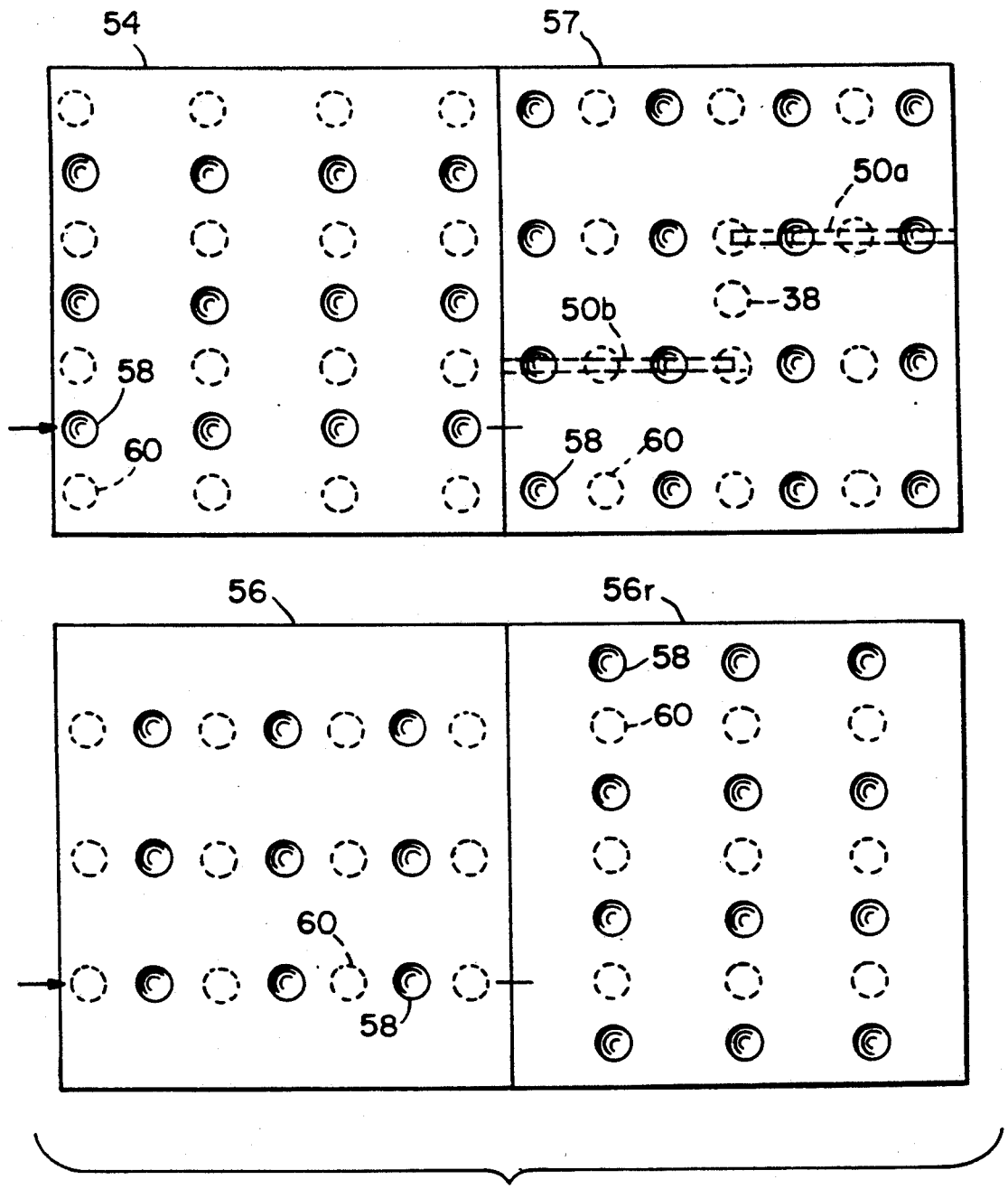
FIG. 6C is a plan view illustrating the arrangement of the sheets in manufacturing a dielectric resonator.

The sheets shown in FIG. 6C are assembled to form resonator 29 having a diamond crystal lattice structure of periodically arranged air spheres 30 as shown in the sectional view in FIGS. 7A-7B. To accomplish this, first sheet 56 is positioned on first sheet 54 such that the hemispheres 60 in the bottom of first sheet 56 are aligned with the hemispheres in the top of first sheet 54. A sheet 56r, which is a sheet 56 rotated ninety degrees, is positioned on top of the first sheet 56 such that the respective hemispheres are aligned. Sheet 57 of FIG. 6B is rotated ninety degrees and stacked onto sheet 56r, and a second sheet 54 is positioned on sheet 57. The first two steps are then repeated for the remaining sheets 56 and 56r. The resulting dielectric resonator 29 may be mounted on a substrate or copper or it may be enclosed inside a metallic cavity.

Alternatively, a resonant structure 39 comprised of overlapping periodically related high-dielectric spheres in an low-dielectric environment such as air can be assembled based on a procedure described below. An assembled resonant structure 29 is shown in FIG. 5. The assembly process for making the structure 29 includes providing a plurality of identical high-dielectric spherical elements 40 which have a sufficient diameter so as to overlap each other in the assembled structure. Preferably, six spheres 41-46 are modified to create a resonant cavity 48 when arranged in the final structure. Additionally, holes may be drilled through two of the six spheres (43 and 46) adjacent to the resonant cavity forming a coupling path. The spheres are then attached together forming a three-dimensional diamond crystal lattice structure. A pair of waveguides 150a and 150b may be provided, serving as input and output ports respectively.

A significant benefit of a resonant device of this invention is its lower power consumption compared to traditional devices. Generally, increasing the number of layers decreases the power consumption of the resulting resonant device. This size-power tradeoff determines the optimum numbers for any particular device. However, any device embodying the resonant structure of the present invention consumes a minimal amount of power, thereby operating at maximum efficiency.

Figure 8:
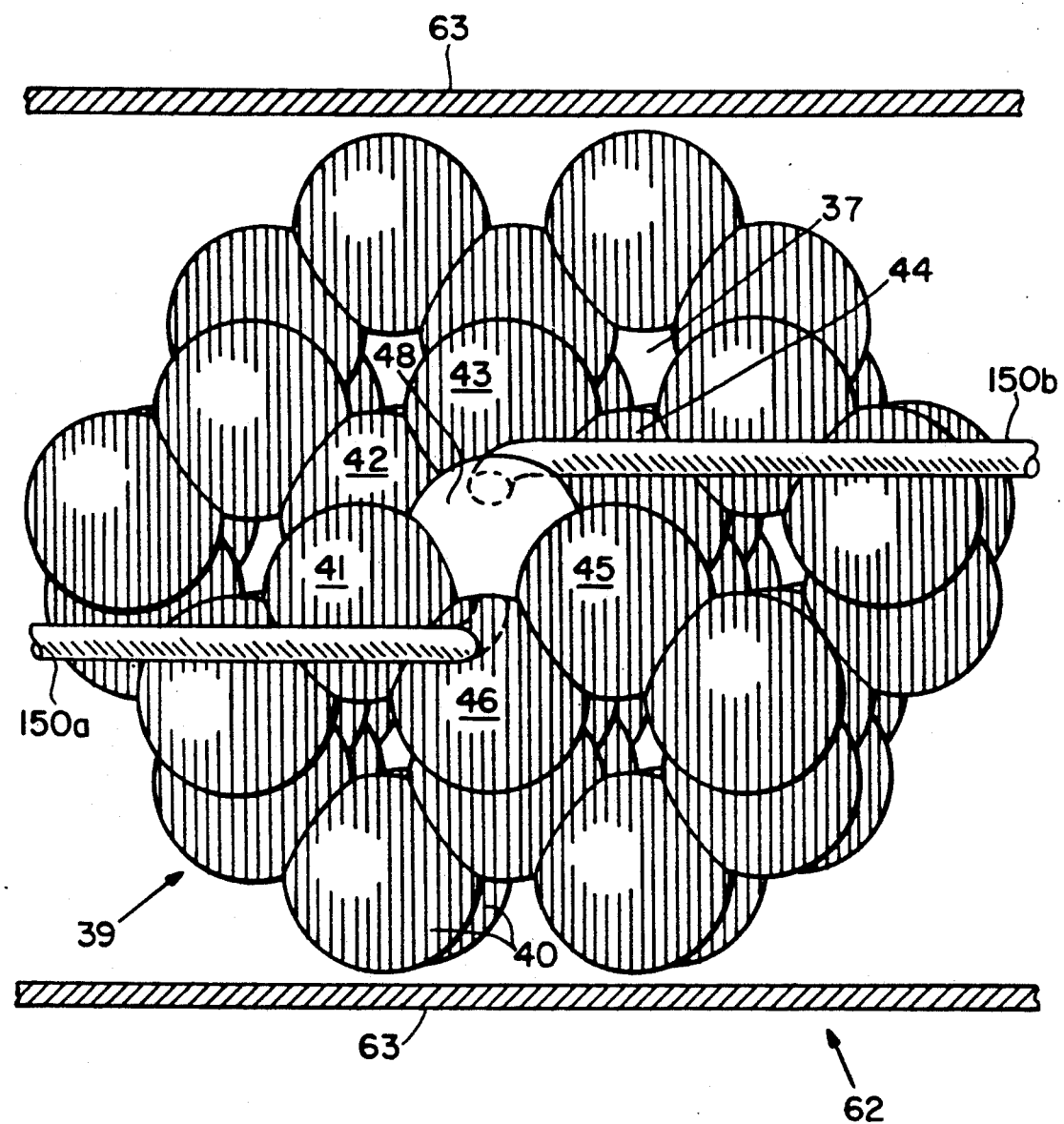
FIG. 8 is a perspective view illustrating a three-dimensional dielectric resonant cavity constructed from a dielectric resonator.

In one embodiment of the present invention, a dielectric resonant cavity 62 comprises the dielectric resonator 39 surrounded by conducting plates 63. As shown in FIG. 8, the resonator 39 comprises a plurality of high-dielectric spheres 40 periodically arranged in a low-dielectric environment such as air. Six spheres 41-46 are modified to create the resonant cavity 48 in the resonant structure 39. Additionally, channels filled with high-dielectric material are formed in two of the six spheres (43 and 46) adjacent to the resonant cavity form a coupling path to the cavity. A first dielectric waveguide 150a may be inserted into sphere 46 for coupling electromagnetic energy into the resonant cavity 48. Similarly, a second dielectric waveguide 150b positioned in sphere 43 provides a path for narrow band electromagnetic energy from the cavity. The dielectric structure 62 may be used in microwave components including integrated circuits.

The unique structure of the dielectric resonator 39 leads to reduced power dissipation losses by the device 62 when used in microwave and millimeter wave components, leading to more efficient performance. As previously stated, the two power loss mechanisms in existing microwave dielectric resonators are polarization loss in the dielectric material and ohmic loss at the conducting plates. Employing a resonator that has several layers of periodically arranged dielectric spheres 40 forming a three-dimensional diamond lattice surrounding the resonant cavity 48 substantially confines electromagnetic radiation. This leads to a weaker field strength at the conducting plates, translating into reduced ohmic losses. Also, the resonator 39 stores a substantial amount of power in the low dielectric regions 37 (air) which have negligible loss tangents. As a result, the average loss tangent for the resonator 39 is much less than the loss tangent for a solid high-dielectric resonator. Thus, polarization losses will be reduced.

Figure 9:
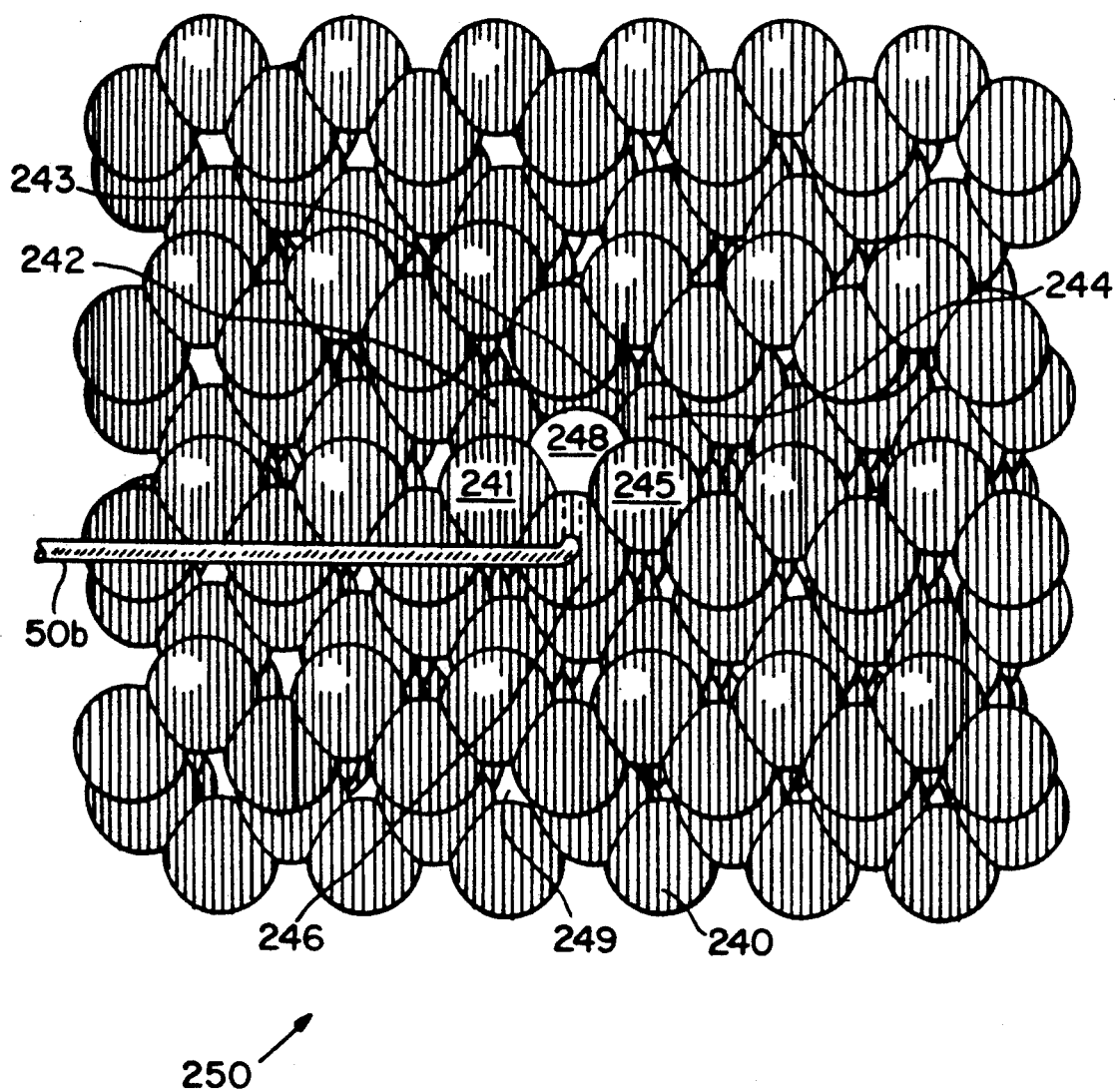
FIG. 9 is a perspective view illustrating a three-dimensional dielectric bandpass filter.

Another embodiment of the present invention comprises a narrow bandpass filter 250 as shown in FIG. 9.

The filter comprises a three-dimensional diamond lattice of high-dielectric overlapping elements including the elements 240 241-246 surrounding a resonant cavity 248. The elements 240 are spherically shaped and are periodically arranged in a low-dielectric background environment 249 such as air. Alternatively, spherically shaped regions of a low-dielectric material such as air may be arranged in a high-dielectric background material without departing from the scope of this invention. The three-dimensional diamond lattice of elements confines electromagnetic energy within a frequency band about the resonant frequency of the cavity 248. Further, the resonant cavity is surrounded by several layers of elements, making the filter very efficient at storing electromagnetic energy in the narrow passband. A dielectric waveguide 50b is coupled into the resonant cavity via element 246 and provides a output path for the narrow frequency band electromagnetic energy confined in the resonant cavity.

Figure 10A:
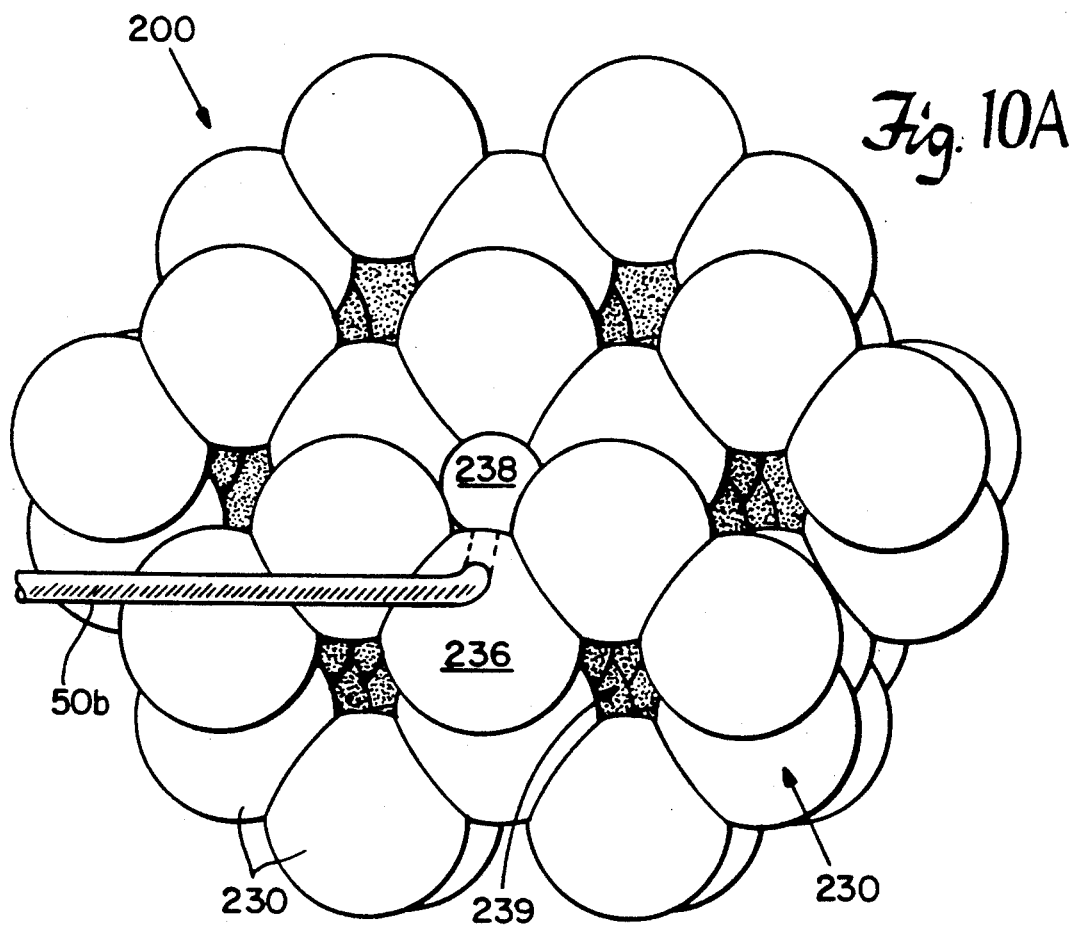
FIG. 10A is a perspective view illustrating a dielectric absorber.

As shown in FIG. 10A, a resonant absorber 200 having a narrow passband comprises yet another embodiment of the present invention. The absorber 200 has a three-dimensional diamond lattice structure comprised of periodically arranged elements 230 of dielectric material disposed in a high-dielectric, lossy interstital material 239. Preferably, the elements 230 are spherically shaped regions of air and the lossy material 239 comprises ferrite. As in the previous embodiments, a resonant cavity 238 is positioned within the lattice and stores incoming electromagnetic energy in narrow frequency band about the cavity's resonant frequency. Further, a waveguide 50b may be coupled through the element 236 to the resonant cavity 238 to provide an output path for the electromagnetic energy.

Figure 10B:
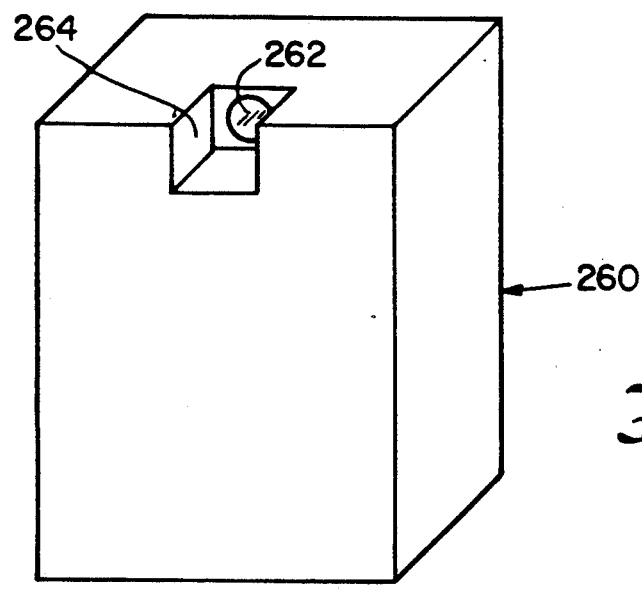
FIG. 10B shows a representative structure in which the dielectric absorber of FIG. 10A is positioned.

Resonant absorbers such as the absorbs of FIG. 10A are used in a variety of applications to reduce the radar cross-section of a structure. Referring to FIG. 10B, a structure 260 has an antenna element positioned behind a window 262 recessed in a volume 264. In accordance with the present invention, the resonant absorber 200 shown in FIG. 10A is positioned in the volume to attenuate microwave radiation over a broad frequency range incident to the antenna element while providing a narrow passband. To that end, the resonant cavity was constructed such that its resonant frequency corresponds to the frequency of the antenna element. Thus, a narrow frequency band of microwave radiation about the frequency of the antenna element propagates through the absorber 200 (shown in FIG. 10A). Note that the waveguide 50b (shown in FIG. 10A) may be coupled to the antenna element to increase the amplitude of the passband radiation. Alternatively, the same result may be achieved by positioning the antenna element within the resonant cavity. The diamond crystal lattice structure of air spheres 230 (shown in FIG. 10A) absorbs incident microwave energy over a broad frequency range within the lattice structure. Except for the narrow passband frequencies, the ferrite material dissipates the microwave radiation, thereby preventing an appreciable amount of energy from backscattering off the antenna element.

In FIG. 10B, one important feature of the resonant absorber 200 (shown in FIG. 10A) is that it may be tuned to any antenna element frequency. To that end, the structure 260 may further comprises a magnetizing means located adjacent to the walls of the volume 264. Magnetizing the ferrite material 239 (as shown in FIG. 10A) changes its dielectric constant which ultimately shifts the frequency response of the absorber. More specifically, the passband frequency range along with the resonant frequency of the cavity 238 are shifted. Thus, the resonant frequency of the absorber can be tuned to correspond to any desired antenna element frequency.

Another embodiment of the present invention comprises a high power generator which provides an increased power generation capability compared to traditionally devices. It is known that hollow metallic cavity resonators are used in power combining techniques, where N active devices are inserted into the cavity to generate N times the power of a single device. As the number of devices increases, the electric field inside the cavity also increases. The maximum number of devices that can be place inside the cavity is ultimately limited by the breakdown field of dry air which is about 2.9 kV/mm. Thus, the power generated by a system of N devices inside the cavity corresponds to the power stored in the cavity when the electric field reaches the breakdown value.

Figure 11:
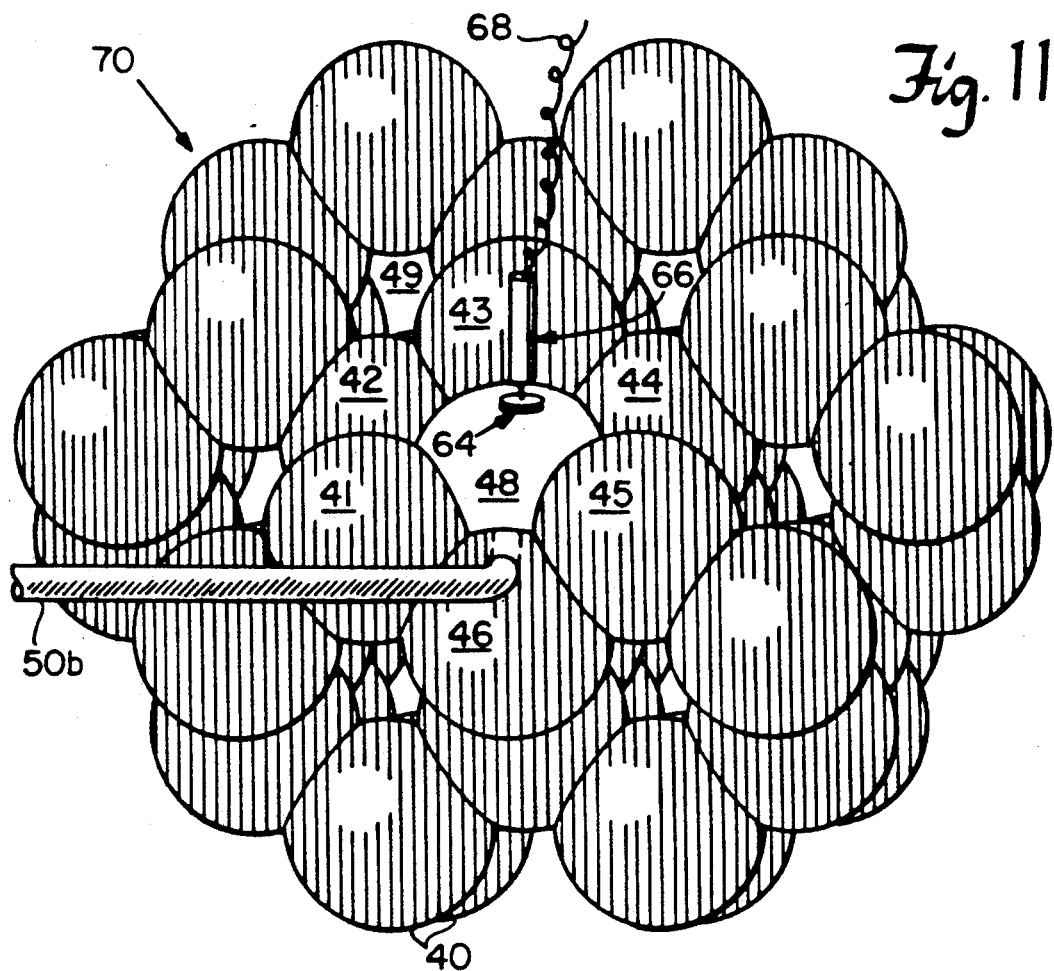
FIG. 11 is a perspective view illustrating a dielectric power generator.

Referring to FIG. 11, a high power generator comprises a hollow resonant cavity 48 surrounded by a periodic arrangement of dielectric elements 40 forming a three-dimensional diamond lattice structure. An active device 64, such as a field-effect transistor (FET), an IMPATT or a GUNN diode, is positioned in the resonant cavity 48. A bias circuit is attached to the active device 64 to match the device's impedance to the impedance of the cavity 48. A cable 68 is linked to the bias circuit to provide power to the active device. A waveguide 50b is provided to direct power out of the cavity 48. As explained previously, the periodic lattice structure surrounding the resonant cavity is highly efficient in storing electromagnetic energy in a narrow passband, preferrably in the microwave and millimeter wave frequency bands. As such, the power generator stores more power than a metallic cavity device at the same resonant frequency when the peak electric field is the same.

Another feature of the power generator is its high efficiency when operated in conjuction with a solid-state oscillator (such as a FET, an IMPATT diode or a GUNN diode) to generate microwave radiation at the resonant frequency of the cavity. Typically, hollow metallic cavity resonators are used and are often operated in a pulsed mode for radar transmission. In typical resonators, cavity losses inhibit performance by dissipating power from the oscillator. Since the power generator 70 efficiently stores power in the cavity at its resonant frequency, less power is dissipated.

Theoretical Basis for the Invention

In order to calculate of the electromagnetic frequency spectrum of a dielectric lattice structure, the electromagnetic fields may be expanded in a plane wave basis, $$H(r) = \sum_G \sum_{\lambda=1,2} h_{G,\lambda} \hat{e}_\lambda e^{i(k+G)\cdot r}$$

where k is in the Brillouin zone, G is summed over the reciprocal lattice, and $e\lambda$ are orthogonal to $(k+G)$. Maxwell's equations are then expressed as a simple eigenvalue equation, $$\sum_{G',\lambda'} H_{G,G'}^{\lambda,\lambda'} h_{G',\lambda'} = w^2 h_{G,\lambda}$$

where $c = 1$ and $$H_{G,G'} = |k + G||k + G'| \epsilon_{G,G'}^{-1} \begin{pmatrix} \hat{e}_2 \cdot \hat{e}_{2'} & -\hat{e}_2 \cdot \hat{e}_{1'} \\ -\hat{e}_1 \cdot \hat{e}_{2'} & \hat{e}_1 \cdot \hat{e}_{1'} \end{pmatrix}$$

and $\epsilon_G^{-1}{}_G$, is the Fourier transform of the dielectric function $\epsilon(r)$. This eigenvalue equation is solved to yield the normal mode coefficients and frequencies of the electromagnetic modes. Having solved for H(r), the other electromagnetic fields can be determined simply. This technique provides a simple and powerful method to solve problems in electrodynamics which takes full account of the vector nature of the electromagnetic radiation. Using this technique the approximations, the finite size of the plane-wave basis and Fourier transform grid, are improved systematically.

Although it is desireable to examine the behavior of a single defect in a lattice of infinite size, computational simplicity leads to a test system employing a crystal lattice structure with a finite unit cell size. To that end, a supercell method is employed in which one defect is positioned in a cell of eight atoms arranged in a plane the form of a diamond structure. A number of diamond cells each having a defect are linked to form a three-dimensional diamond crystal lattice. It should be noted that diamond lattice structure having multiple defects has been employed during testing for computational simplicity. However, the test results have been corrected to correspond to a crystal lattice having a single defect in accordance with the present invention. A diamond lattice has been used for the test calculations, although the present invention comprises any cell structure which forms a face-centered cubic crystal lattice. Tests have been performed using larger supercells containing 16 and 32 atoms and similar results were found. Supercells of two, four, eight and sixteen atoms containing dense impurities in the planes have been considered in order to determine the dependence of bandwidth on impurity separation. Based on calculations of a one-dimensional system of periodic dielectric slabs, for which an exact solution is available, it is expected that the frequencies provided below are correct to within ~2% at this plane-wave cutoff. Although fully converged calculations in these one-dimensional systems agreed to 0.1% it has been determined that convergence in absolute frequencies was relatively slow in comparison to conventional electonic structure calculations. This is attributed to the discontinuity in the first derivative of H(r) at the dielectric surfaces. In order to calculate the density of photonic states $D(\omega)$, the frequencies should be sampled at 48 k-points in the irreducible Brillouin zone of the eight atom unit cell, and then coarse grained the resulting frequencies. The wave dispersion relation was also employed. The relation is as follows: $\omega(k) = Vk$ where $\omega$ is the temporal frequency of electromagnetic energy, k is the spatial frequency of the energy and v is the speed of light in a dielectric medium. Although it has been explicitly verified using the wave dispersion relation that $\omega(k) = vk$ at long wavelengths and therefore $D(\omega) \approx \omega^2$, this is not accurately represented in $D(\omega)$ due to coarse sampling of the Brillouin zone.

A periodic arrangement of spheres of air in a dielectric medium has been considered. A material with dielectric constant of 35 and air spheres of radius 0.29 a, where a is the conventional lattice constant of the diamond cell has also been considered. Impurities of two types have been considered: air spheres in the dielectric region which were located at the diamond hexagonal site and air spheres place at the bond-centered site.

Figure 12:
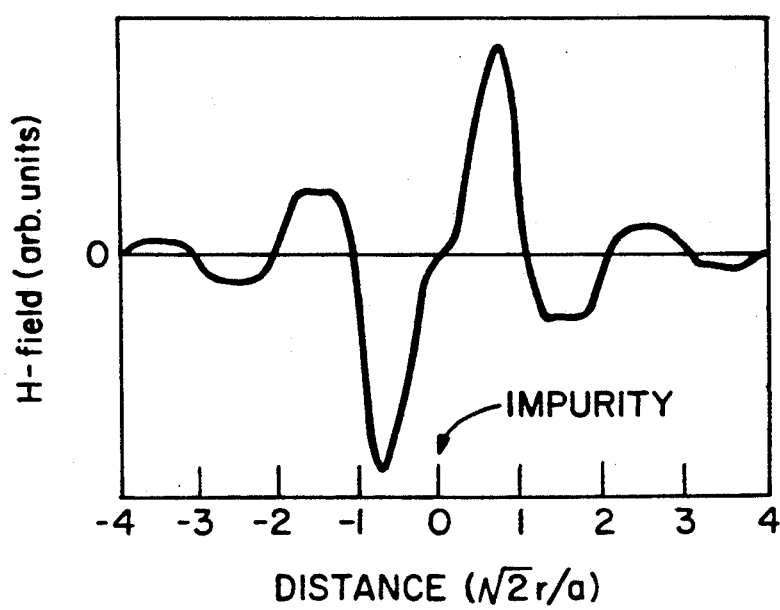
FIG. 12 shows the decay of the localized electromagnetic field near the defect structure.

Since the applicability of a band structure breaks down when an impurity destroys the translational symmetry of the dielectric lattice, the density of states of the impurity system was calculated. Calculations show that perfect bulk diamond crystal has a gap in its photonic band structure. As shown in FIG. 4A, placing an air sphere at the hexagonal site introduces a single state in the gap, $\omega_b$. Since there are no travelling modes in the diamond lattice at $\omega_b$ this must be a localized mode. As shown in FIG. 12, calculations have shown that the field is localized about the defect. In fact, it has been determined that bound states whose frequencies are in the center of the gap have decay lengths as small as one lattice constant. It can be expected that this length will diverge as the bound state frequency approaches the continuum of extended states.

Figure 4B:
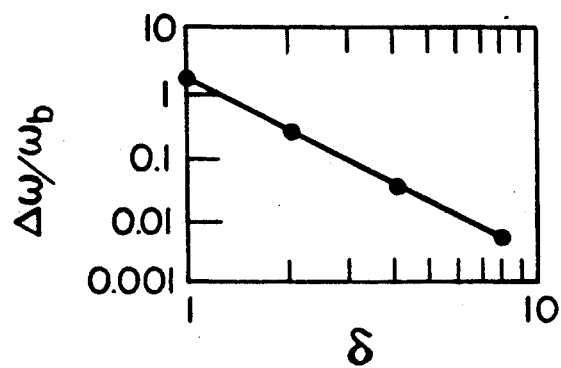
FIG. 4B is a graph showing the relationship of the bandwidth for increasing impurity separations.

Recall that in FIG 4A the localized modes are spread over modest range of frequencies. This is purely an artifact of the supercell technique employed. Because the technique considers an array of defect states each of which is localized over some finite distance, there is tunneling between localized states on neighboring impurities. It is this hopping between defect states that introduces a non-zero width to the impurity band. For simplicity, the maximum of the defect density of states was chosen to identify the actual position of the impurity state. Referring to FIG. 4B, a relationship of the bandwidth for increasing impurity separations is shown. This bandwidth decreases exponentially, as expected for exponentially bound states. In an experiment, the lattice has a finite size so that the impurity mode will have some exponentially small amplitude at the walls of the lattice. This allows the localized state to tunnel out, and introduces a finite width to the frequency spectrum.

Qualitatively, this result may be understood by analogy with the more familiar case of impurities in a crystal with a band gap in its electronic structure. Since the wavelength of light is shorter in the dielectric, these regions are analogous to a region of deep potential in the crystal. Inserting a dielectric impurity adds an attractive potential. Sufficiently strong potentials can pull a state out of the photonic conduction band into the gap, and increasing the attractive character causes a decrease in the bound state frequency (see FIG. 3). Similarly, adding an air sphere to the dielectric region is analogous to adding a repulsive porential which pushes a state out of the photonic valence band. In fact, the addition of an air sphere defect to the perfect diamond lattice decreased the number of valence states by one, and it created one state in the gap. One notable difference between air and dielectric impurities has been found. While the presence of an air sphere creates a single, well defined state in the gap, the presence of an air sphere creates a single, well defined state in the gap (the lowest of which is doubly degenerate). This is reasonable because of the large number of bands above the gap.

Alternately, one can understand the localized mode as a three-dimensional Fabry-Perot interferometer.

Since there are no propagating modes in the dielectric material with frequencies in the gap, it behaves as a mirror to these frequencies. The defect then is surrounded by reflecting walls, and the localized state is analogous to the familiar resonances of a metallic cavity. Thus, many microwave and millimeter wave applications exist for dielectric resonators.

While this invention has been particularly shown and described with references to preferred embodiments thereof, it will be understood by those skilled in the art that various changes in form and details may be made therein without departing from the spirit and scope of the invention as defined by the appended claims.

We claim:

1. A dielectric resonator comprising:
    a first dielectric material for receiving electromagnetic energy;
    a lattice structure comprised of a plurality of shaped elements comprised of a second dielectric material and disposed in a multi-dimensional periodic arrangement within the first dielectric material to provide a range of frequencies over a band gap in which the electromagnetic energy within the frequency range of the band gap is prevented from propagating through the lattice structure; and
    a resonant defect structure disposed within the lattice structure for introducing a lattice imperfection in the lattice structure, the resonant defect structure providing a frequency range within the band gap in which the electromagnetic energy having frequencies in the frequency range within the band gap is allowed to propagate through the lattice structure.

2. A dielectric resonator as claimed in claim 1 further comprising a coupler connected to the resonant defect structure, the coupler having a first waveguide for coupling the electromagnetic energy into the defect structure and a second waveguide for coupling the electromagnetic energy having frequencies in the frequency range, which is allowed to propagate through the lattice structure, from the resonant defect structure.

3. A dielectric resonator as claimed in claim 1 in which the lattice structure is configured in the form of a face-centered cubic crystal.

4. A dielectric resonator as claimed in claim 1 in which the lattice structure is configured in the form of a diamond lattice crystal.

5. A dielectric resonator as claimed in claim 1 in which the first dielectric material comprises air.

6. A dielectric resonator as claimed in claim 5 in which the shaped elements are spheres, each spherical element having a diameter such that said spherical element overlaps adjacent spherical elements upon being disposed in said multi-dimensional periodic arrangement.

7. A dielectric resonator as claimed in claim 1 in which the shaped elements are spheres.

8. A dielectric resonator as claimed in claim 1 in which the resonant defect structure comprises a dielectric cavity.

9. A dielectric resonator as claimed in claim 1 in which the second dielectric material comprises air.

10. A dielectric resonator comprising:
    a first dielectric material for receiving electromagnetic energy;
    a lattice structure comprises of a plurality of shaped elements comprising of a second dielectric material and disposed in a multi-dimensional periodic arrangement within the first dielectric material to provide a predetermined frequency band gap in which the electromagnetic energy having frequencies within the band gap is prevented from propagating through the lattice structure;
    a resonant defect structure disposed within the lattice structure for providing a lattice imperfection in the lattice structure, the resonant defect structure providing a narrow frequency range within the band gap wherein the electromagnetic energy having frequencies within the narrow frequency range is stored within the resonant defect structure; and
    an output coupler linked to the resonant defect structure for coupling the electromagnetic energy having frequencies within the narrow frequency range and being stored in the resonant defect structure therefrom.

11. A dielectric resonator as claimed in claim 10 in which the resonant defect structure comprises a dielectric cavity.

12. A dielectric resonator as claimed in claim 10 further comprising an input coupler for coupling the electromagnetic energy into the defect structure.

13. A dielectric resonator as claimed in claim 10 in which the frequency band gap is within a frequency range of 1–3000 GHz.

* * * * *

UNITED STATES PATENT AND TRADEMARK OFFICE
CERTIFICATE OF CORRECTION

PATENT NO. : 5,187,461
DATED : Feb. 16, 1993
INVENTOR(S) : Karl Brommer, Henry Mullaney, Robert Meade, Andrew Rappe and John Joanopoulos It is certified that error appears in the above-identified patent and that said Letters Patent is hereby corrected as shown below:

Col. 1, line 8, delete "Contract Number N00014-86-K-0158" and insert --Contract Number N00014-90-J-1370--.

Signed and Sealed this

First Day of March, 1994

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO. : 5,187,461

DATED : Feb. 16, 1993

INVENTOR(S) : Karl Brommer, Henry Mullaney, Robert Meade, Andrew Rappe and John Joannopoulos It is certified that error appears in the above-identified patent and that said Letters Patent is hereby corrected as shown below:

Col. 12, line 19, delete "comprises" and insert --comprised--.

Signed and Sealed this

Twenty-sixth Day of July, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,187,461
DATED : February 16, 1993
INVENTOR(S) : Karl Brommer, Henry Mullaney, Robert Meade, Andrew Rappe and John Joannopoulos It is certified that error appears in the above-indentified patent and that said Letters Patent is hereby corrected as shown below:

On the title page itsert the following:

-- 73 Assignees:
            Massachusetts Institute of Technology, Cambridge, MA.--

On the title page item [76],
inventors' names should be changed from "John Joanopoulos" to --John Joannopoulos--.

Signed and Sealed this

Thirty-first Day of October 1995

Attest:

BRUCE LEHMAN

Attesting Officer      Commissioner of Patents and Trademarks